United States Patent
Huynh et al.

(10) Patent No.: US 6,300,246 B1
(45) Date of Patent: Oct. 9, 2001

(54) METHOD FOR CHEMICAL MECHANICAL POLISHING OF SEMICONDUCTOR WAFER

(75) Inventors: Cuc K. Huynh, Jericho; Paul A. Manfredi, Waterbury Center; Thomas J. Martin, Franklin; Douglas P. Nadeau, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/718,009

(22) Filed: Nov. 21, 2000

(51) Int. Cl.$^7$ .................................................. H01L 21/461
(52) U.S. Cl. ............................................ 438/690; 438/692
(58) Field of Search ................... 134/2, 3, 6, 7; 438/692, 691, 689, 690

(56) References Cited

U.S. PATENT DOCUMENTS

| | | |
|---|---|---|
| 4,129,457 | 12/1978 | Basi . |
| 5,078,801 | 1/1992 | Malik . |
| 5,545,076 | 8/1996 | Yun et al. . |
| 5,876,508 * | 3/1999 | Wu et al. .................................. 134/2 |
| 5,906,949 * | 5/1999 | Sato ...................................... 438/692 |
| 5,963,821 | 10/1999 | Kai et al. . |
| 5,972,124 * | 10/1999 | Sethuraman et al. ..................... 134/7 |
| 5,981,301 | 11/1999 | Muramtsu et al. . |

* cited by examiner

Primary Examiner—David Nelms
Assistant Examiner—Thao P Le
(74) Attorney, Agent, or Firm—Robert A. Walsh

(57) ABSTRACT

Semiconductor materials are prepared by CMP with a first rough polishing step using an acidic slurry followed by cleaning a the pad and wafer separately. After cleaning a second polishing step with a basic slurry is used which buffs the wafer. Finally the pad and wafer are rinsed while a low pressure is applied to complete the process.

14 Claims, 1 Drawing Sheet

METHOD FOR CHEMICAL MECHANICAL POLISHING OF SEMICONDUCTOR WAFER

BACKGROUND OF THE INVENTION

1. Field of the Invention

This invention relates to semiconductor fabrication processes, and a more particularly, to a method for cleaning the slurry remnants left on a polishing pad and wafer after the completion of a chemical-mechanical polish (CMP) process conducted for global polarization of a semiconductor wafer.

2. Description of Related Art

In the fabrication of semiconductor products, such as CPU's and various memory devices, the (MP technique is a global planaization process which can provide a flat and polished surface for a semiconductor wafer. It is currently the only semiconductor technology that can provide a global planaization of semiconductor wafers.

In a CMP process, the Surface of the wafer that is to be polished (hereinafter referred to as the process surface of the wafer) is placed upside down on a polishing pad on a CMP machine. The polishing pad can be rotated so as to rub against the process surface of the wafer. During the CMP process, a chemical agent, which is customarily referred to as a slurry, is applied on the wafer to assist the polishing pad in polishing the process surface of the wafer.

The Slurry can be a mixture of colloidal silica, dispersed alumina, and an alkaline solution, Such as KOH or $NH_4OH$ or $CeO_2$ base slurry. Tlie colloidal silica and dispersed alumina particles, which are highly abrasive in nature can help to polish the process surface of the wafer on the polishing pad.

After the completion of each CMP process, the slurry remnants left on the polishing pad should be cleaned away prior to processing a subsequent CMP process on another wafer. One conventional method of cleaning the slurry remnants on the polishing pad after the completion of a CMP process is depicted in detail in the following with reference to FIGS. 1A and 1B.

Referring to FIG. 1A, there is shown a polishing pad 10 after the completion of a CMP process. This polishing pad 10 has been treated by a pad dresser (not shown). After the CMP process, a large amount of slurry remnants 12 are left on the polishing pad 10, which should be cleaned away before another wafer can be placed and polished on the polishing pad 10. To remove the slurry remnants 12, a stream of deionized water 14 is jetted on the polishing pad 10 so as to clean away the slurry remnants 12 left on the polishing pad 10.

One drawback to the foregoing method, however, is that it is not effective at thoroughly cleaning away all of the slurry remnants 12 left on the polishing pad 10. As shown in FIG. 1B, a small amount of the slurry remnants 12 may still remain on the polishing lopad 10. When these uncleaned slurry remnants 12 dry out, they could cause scratches to the subsequent wafers that are placed on the polishing pad 10 to undergo a CMP process. This will significantly affect the wafer yield rate.

SUMMARY OF THE INVENTION

It is therefore a primary objective of the present invention to provide a method for cleaning the slurry remnants left on a polishing pad after the completion of a CMP process in which two slurry materials are used for a primary and secondary polish.

It is another objective of the present invention to provide a method for aggressively rinsing the first slurry remnants left on a polishing pad and wafer after the completion of the primary polish step which starts the first slurry remnants left on the polishing pad and wafer to be more easily cleaned away and to minimize the cross contamination of slurry materials.

In accordance with the foregoing and other objectives of the present invention, a new method for cleaning the first and second slurry remnants left on a polishing pad after the completion of a CMP process is provided.

In the method of the invention, the first polish is conducted using a first slurry and a second polish is conducted using a second slurry of different chemical composition. The polishing pad, of the first polish, and the wafer are cleaned between the first and second polish to avoid cross-contamination.

Prior to second polish a water cleaning spray is directed onto the wafer to remove contaminants prior to the second polish step. A cleaning agent such as DI $H_2 O$ is used to rinse the polishing pad. The wafer is then forced against the pad with a second slurry material being applied for the appropriate polish, and subsequently followed by a low pressure rinse step on the same pad, known as, the buffing and cleaning step.

It is a distinctive feature of the invention that when using two different slurries, the problem of cleaning the pad and wafer is aggravated by several factors. The greatest problem results from the chemical interaction when the slurries come into contact with each other. This contact results in precipitates which, due to resulting nature of the new precipitates Ihave a great affinity to the processed surface of the wafer.

BRIEF DESCRIPTION OF DRAWINGS

The invention can be more fully understood by reading the following detailed description of the preferred embodiments, with reference made to the accompanying drawings, wherein.

DESCRIPTION OF PREFERRED EMBODIMENT

Figure 1A:
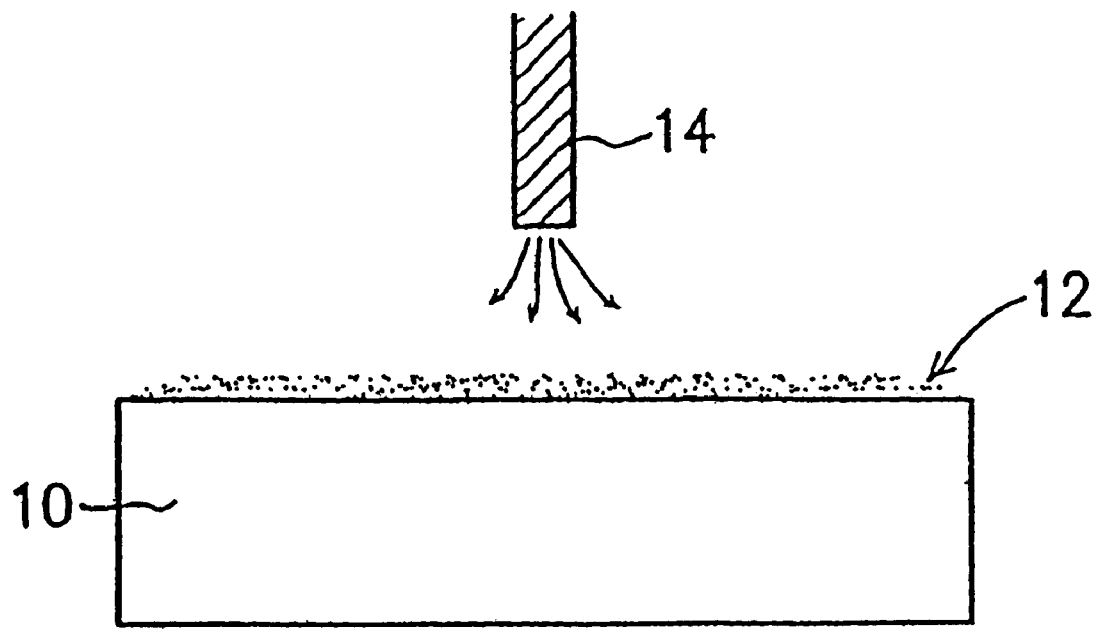
FIGS. 1A and 1B are schematic sectional diagrams used to explain the drawbacks of a conventional method for cleaning the slurry remnants left on a polishing pad after the completion of a CMP process.
Figure 1B:
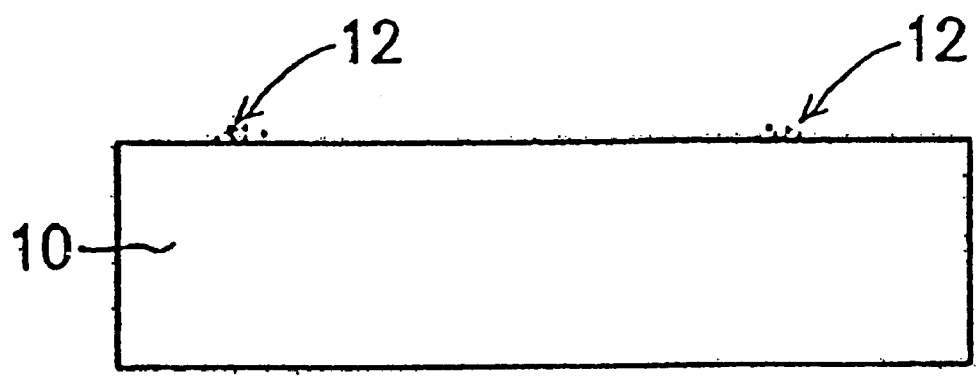

The CMP process requires the use of slurries to assist in the removal of material from the process surface of the wafer. These slurries contain abrasive materials such as alumina, silicon dioxide and cerium oxide. The slurries also include a liquid carrier which may be acidic with a low pH value or basic with a high pH value. In the removal of various metals such as copper and TaN/Ta and/or Tugsten and TiN there results in a material loading on the polish pad as well as contaminants carried on to the wafer. This is further aggravated when two slurries are used especially when one is acidic and the other basic. The progressive chemical interaction of two different slurries is evidenced in an accumulation on the second polish pad surface. This contamination has an accumulative effect in that as the process continues, the increase of contaminates observed increases with each successive wafer processed.

The observed accumulation of contaminates is propagated with the polished wafer and its carrier or holder device, carrying the constituents of the first polish, to the second polish. Not only is the wafer and the carrier device surfaces' responsible for the cross contamination, the wafer holder device's associated backing pad and vacuum chambers all may contribute to this phenomenon. In one case, the observed second pad contaminates are the metals and/or suspended abrasives of the first slurry precipitating from their suspended state, onto the second polish surface. This cumulative contamination is the result of various effects including of pH changes of the slurry chemistries. The observed chemical interaction of the slurries, resulting in the increase in contaminates such as metals and/or abrasives, has led the inventors to establish a new CMP process which allows for better control of the contaminate, resulting in higher yields with less down time.

In the two step process the majority of removed material on the process surface is accomplished during the first rough polishing step using an acidic slurry having a pH between 2–4 with alumina abrasives. In situations where acidic or basic slurries or combination of slurries are used, the chemical interaction continues, even after the wafer is removed from the polishing pad. Control of the CMP polish process is maintained by minimizing the cross contamination of the two slurries which is facilitated by the polished wafer and wafer's carrier minimizing contact of one slurry to the other. Thus, rinsing all components after any polish cycle is critical to minimize contamination. Rinsing the empty wafer carrier after one complete polish cycle that is from the point of picking up a wafer to discharge of a completed wafer, is also important in this process.

In the case of using acidic slurry in polishing, it is imperative that the polish pad must be cleaned without the wafer present, after the acidic polish cycle is completed. If the wafer is present, during the pad cleaning rinse, scratching will likely result since dilution of acidic slurry raises the pH, causing the slurry's constituents and/or abrasives to come out of suspension and causing contamination. The cleaning of the wafer, during pad rinse may be performed with basic pH slurries such as silica suspended in a basic solution, such as, KOH or equivalent. Testing of a second polish using basic slurry showed no associated defects were created. Accordingly to better control the CMP process, the wafer is removed from the first pad at which point the first pad is thoroughly cleaned and the wafer is cleaned by rinsing with DI $H_2O$. After the pad is redressed/rejuvenated to remove contaminates and prevent further accumulation of slurry it can be used for a second polish step. This second polish step could also be accomplished at a second polishing station with a different pad. The cleaned process surface is now presented for the second or final polish step. During this step a second basic sluny preferably KOH with silicon dioxide abrasive with a pH of 8–12 may be applied and the wafer is pressed against the surface at an appropriate pressure and time to accomplish the second polish goal. When the desired results are achieved for the second polish step, such as, an oxide buff wherein, the contaminant or target material is removed, rinsing the pad with wafer present. Preferably a low pressure force is applied between the wafer against the pad which results in simultaneous cleaning of wafer and pad. This step is important for the preparation of the pad for the subsequent polish, and for effective wafer cleaning at the completion of the polish cycle, thus minimizing effluent accumulation in the subsequent cleaning process. This is followed by a $H_2O$ buffing at 1 psi which is followed by a final cleaning with water.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed:

1. A method for polishing a semiconductor wafer temporarily mounted on a carrier comprising the steps of:

a) rough polishing a surface of the wafer on a first pad on a first polish table using a first slurry solution;

b) removing the wafer from the first polish table;

c) rinsing the first pad with a cleaning fluid;

d) rinsing the wafer and carrier with a second fluid;

e) second polishing of the wafer surface with a second slurry solution and then;

f) simultaneously rinsing the wafer, the carrier and the pad that the second polishing is performed on with a third fluid while the wafer surface remains in contact with the pad by applying low pressure force between the wafer surface and the pad to complete the second polish step.

2. The method according to claim 1 which includes a final step of rinsing the wafer carrier after the wafer has been unloaded and prior to loading a new wafer to repeat the process.

3. A method, according to claim 1, where in: the first slurry solution is acidic with a low pH between 2–4.

4. A method according to claim 1 wherein the first slurry uses abrasives of either alumina, silicon dioxide, or cerium oxide.

5. A method according to claim 1, wherein the wafer after the rough polishing is removed prior to rinsing the pad in order to prevent scratching of the wafer surface.

6. A method according to claim 5, wherein the cleaning fluid is applied using pressurized means.

7. A method according to claim 6, wherein the rinsing of the first pad is preformed, simultaneously while the wafer is being rinsed separately.

8. A method according to claim 1, wherein a second slurry has a pH range of 8–12.

9. A method according to claim 8, wherein the second slurry has silicon dioxide abrasive material.

10. A method according to claim 2, wherein wafer carrier is rinsed after the wafer is removed.

11. A method according to claim 1, wherein the first pad and the pad that the second polishing is performed on are the same pad.

12. A method according to claim 1, wherein the first pad and the pad that the second polishing is personnel on are not the same pad.

13. A method according to claim 1, wherein the second fluid comprises DI $H_2O$.

14. A method according to claim 1, wherein the third fluid comprises DI $H_2O$.

* * * * *